(12) United States Patent
Schmidt et al.

(10) Patent No.: US 6,368,149 B1
(45) Date of Patent: Apr. 9, 2002

(54) INSULATING COVER FOR DUAL CONNECTOR

(75) Inventors: Robert L. Schmidt; George Woznicska, both of Chicago, IL (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/519,097

(22) Filed: Mar. 6, 2000

(51) Int. Cl.[7] .............................................. H01R 13/52
(52) U.S. Cl. ........................................ 439/519; 439/569
(58) Field of Search ................................. 439/519, 521, 439/76.1, 76.2, 901, 949, 559, 562, 563, 571, 572; 362/221, 225, 260; 174/138 F

(56) References Cited

U.S. PATENT DOCUMENTS

| | | |
|---|---|---|
| 2,779,496 A | 1/1957 | Henderson ................. 220/3.92 |
| 3,135,822 A | 6/1964 | Baran et al. .................. 174/59 |
| 4,392,701 A * | 7/1983 | Weidler ..................... 439/76.1 |

* cited by examiner

*Primary Examiner*—Gary Paumen
*Assistant Examiner*—Ross Gushi

(57) ABSTRACT

A ballast assembly facilitates alternative wiring configurations via the use of one or more dual-port connectors with corresponding insulating covers. The dual-port connectors provide a choice of wiring options, and the insulating cover provides the protection of the connector from the ingress of materials during the manufacturing process. In a preferred embodiment, the insulating cover is configured to reduce the potential of damage, to people or equipment, during the assembly of a lighting fixture containing this ballast assembly, and is also configured to provide the electrical isolation and protection required or desired for safety concerns. In a preferred embodiment, the insulating connector forms access regions about each port of the dual connector that are physically and electrically isolated from one another, and physically and electrically isolated from the access holes in the enclosure material, which is typically sheet metal.

18 Claims, 3 Drawing Sheets

US 6,368,149 B1

INSULATING COVER FOR DUAL CONNECTOR

BACKGROUND OF THE INVENTION

1. Field of the Invention

This invention relates to the field of electronic enclosures, and in particular to enclosures suitable for ballast equipment in lighting fixtures.

2. Description of Related Art

A ballast is commonly used in lighting fixtures to provide a conversion from an available source of electricity to the voltages or currents required for effective and efficient operation of the lamps in the lighting fixture. The ballast assembly may also include the appropriate circuitry for dimming or otherwise controlling the output of the lamps.

A lighting fixture's appearance, size, or form factor are often the key distinguishing feature among competing manufacturers. To provide the design flexibility required in order to accommodate various design styles, yet at the same time achieve the economy of scale that a commonality of components provide, manufacturers prefer components, such as ballasts, that can be used in a variety of arrangements. In the case of ballast assemblies, for example, the variety includes alternative entry points for wires, depending upon how the assembly is oriented relative to a supply cord, the lamps, a switch, and so on. Traditionally, such variety can be achieved by providing "knock-outs" on ballasts, wherein the manufacturer "knocks-out" a stamped portion of the enclosure at the desired orientation. Traditional enclosures, however, are typically made of sheet metal, and the knock-outs result in raw edges that can cause damage to the wires, or injury to the person installing the wires; escutcheons are often added to prevent such damage, further increasing the cost of the assembly. The use of knock-outs also precludes the use of conventional "push connectors" that ease manufacturing by allowing the wires to be connected to the ballast circuitry by merely pushing them into connectors that are mounted on circuit board, because the access hole in the enclosure must be aligned with the connector.

Safety issues also affect the design of ballast assemblies. Some conductors, such as those carrying the supply voltage and current, have more stringent requirements than those carrying low voltage control signals, or low lamp voltages and currents. Additionally, safety issues often mandate particular isolation requirements between different conductors.

The manufacture of ballast assemblies often include the use of "potting material" that is used to "pot" components onto a circuit board or other mounting surface. The potting material is applied as a semi-liquid material that is poured onto the surface before or after the component is placed onto the surface, and allowed to cure into a solid that affixes the placement of the component. The potting material may be used to provide a mechanical integrity to the mounting of a massive component, such as a transformer, or may be used to affix a particular setting of an adjustable component, such as a trimming resistor, or it may be applied to provide a thermal coupling between components that generate heat and corresponding components that regulate the heat. The use of potting material is often problematic with regard to the use of the push-connectors discussed above. A small amount of potting material can render the spring mechanisms of push-connectors inoperative or unreliable. An unreliable connection is often not detected until late in the manufacturing process, or until the light fixture is installed at a consumer's location. The resultant repair cost, and potential damage to the manufacturers reputation, caused by a late discovery of a problem can be substantial.

BRIEF SUMMARY OF THE INVENTION

It is an object of this invention to provide a ballast assembly that can support a variety of installation configurations. It is a further object of this invention to provide a ballast assembly that can be alternatively configured without using knock-outs. It is a further object of this invention to provide a ballast assembly that facilitates ease of manufacture. It is a further object of this invention to provide a ballast assembly that facilitates adherance to safety issues and mandates. It is a further object of this invention to provide a ballast assembly that protects connectors from materials that are used in the assembly during the manufacturing process.

These and other objects are achieved by providing a ballast assembly that facilitates alternative wiring configurations through the use of one or more dual-port connectors with corresponding insulating covers. The dual-port connectors provide a choice of wiring options, and the insulating cover provides the protection of the connector from the ingress of materials during the manufacturing process. In a preferred embodiment, the insulating cover is configured to reduce the potential of damage, to people or equipment, during the assembly of a lighting fixture containing this ballast assembly, and is also configured to provide the electrical isolation and protection required or desired for safety concerns. In a preferred embodiment, the insulating connector forms access regions about each port of the dual connector that are physically and electrically isolated from one another, and physically and electrically isolated from the access holes in the enclosure material, which is typically sheet metal.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 1:
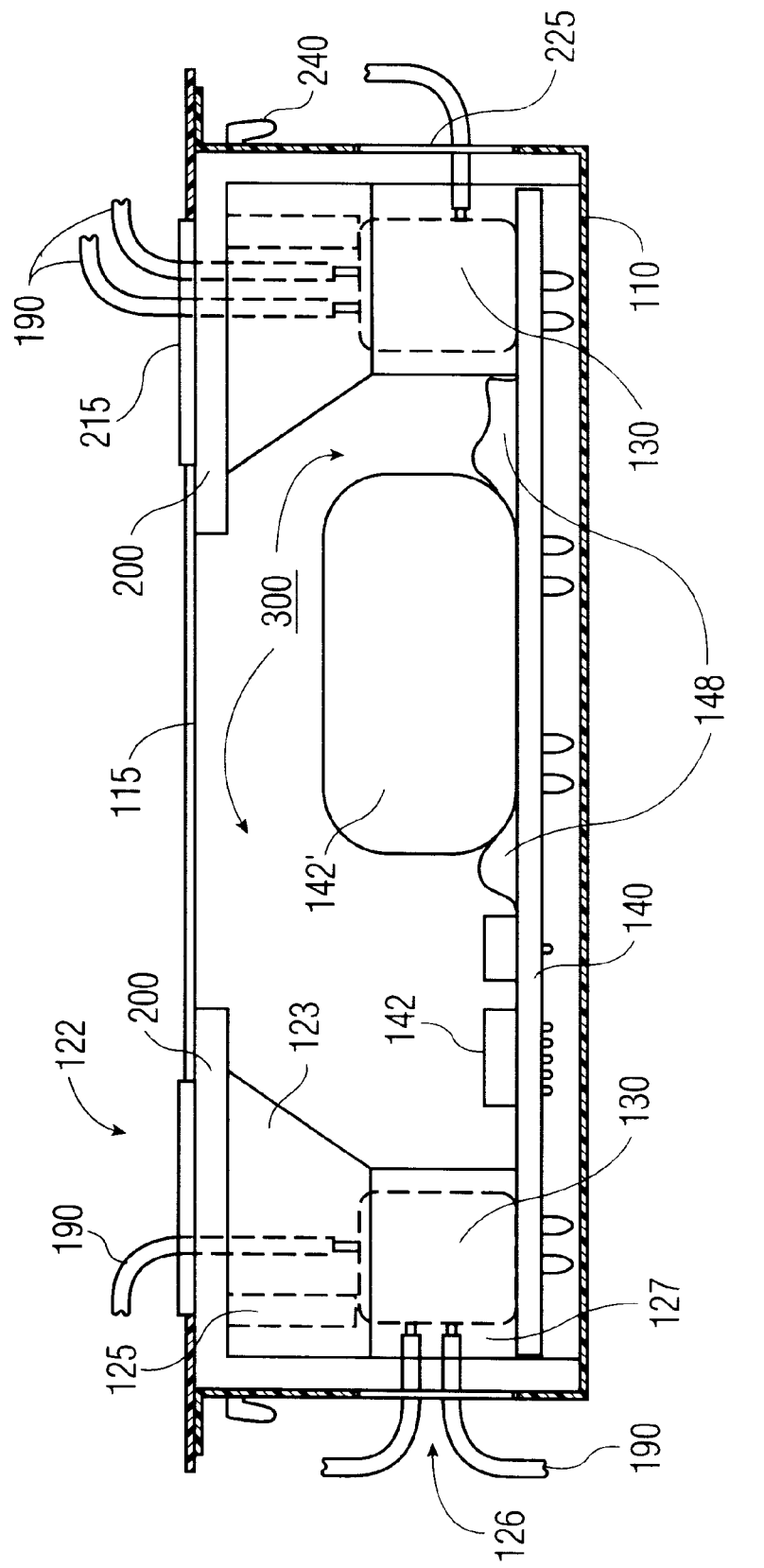
FIG. 1 illustrates an example ballast assembly in accordance with this invention.
Figure 2A:
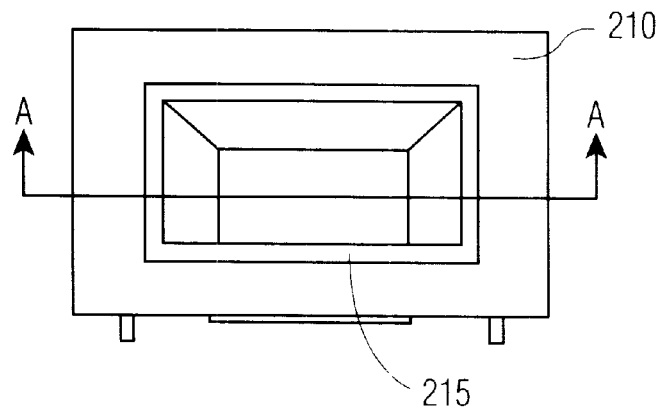
FIG. 2 illustrates an example insulating cover in accordance with this invention.
Figure 2B:
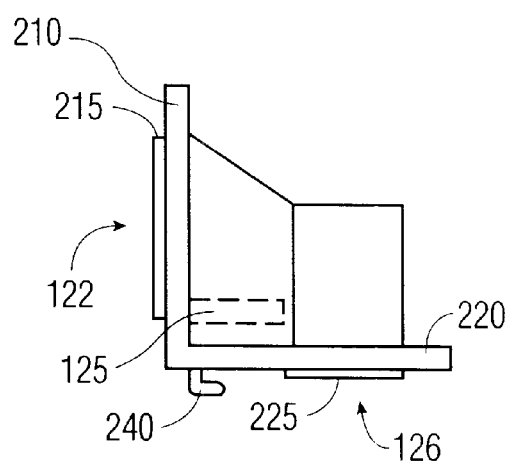
Figure 2C:
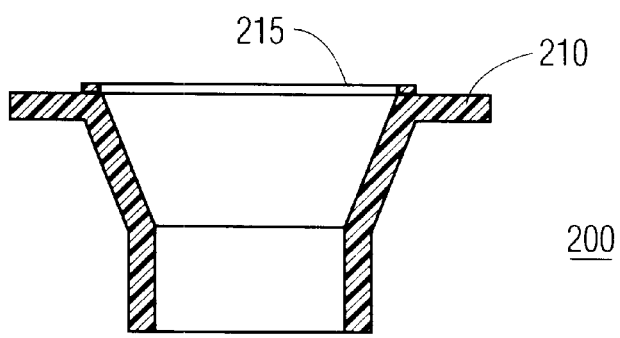
Figure 2D:
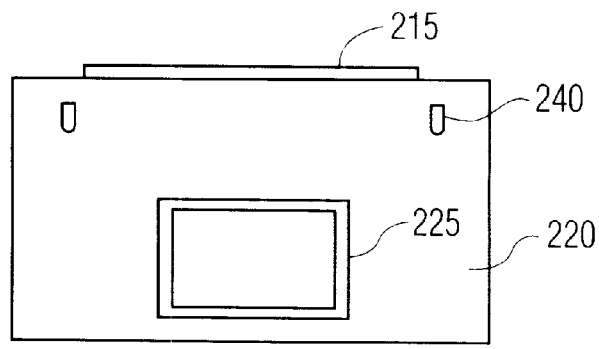
Figure 3A:
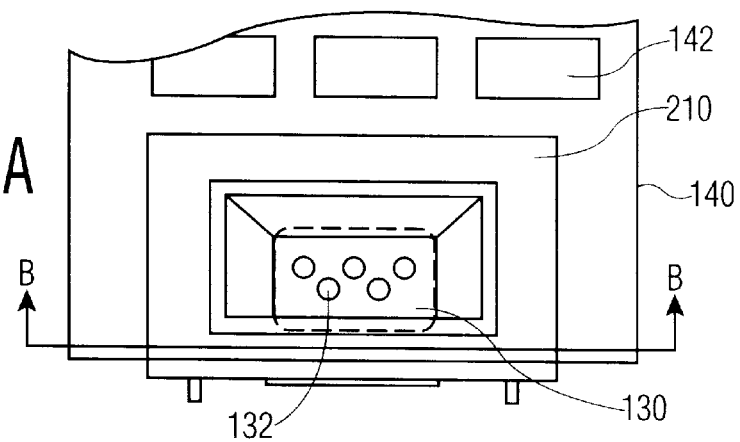
FIG. 3 illustrates an example view of an assembly configuration of a dual connector and insulating cover in accordance with this invention.
Figure 3B:
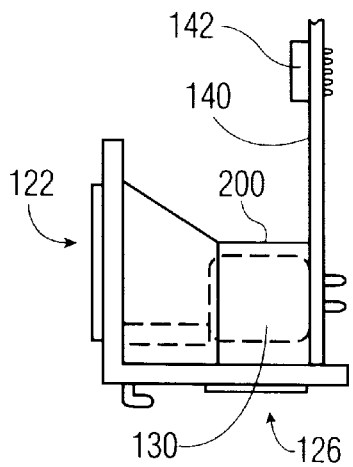
Figure 3C:
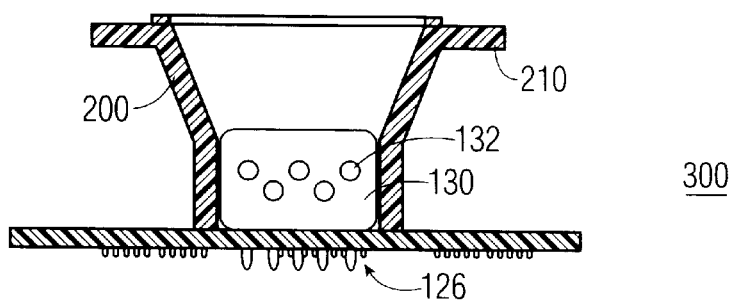
Figure 3D:
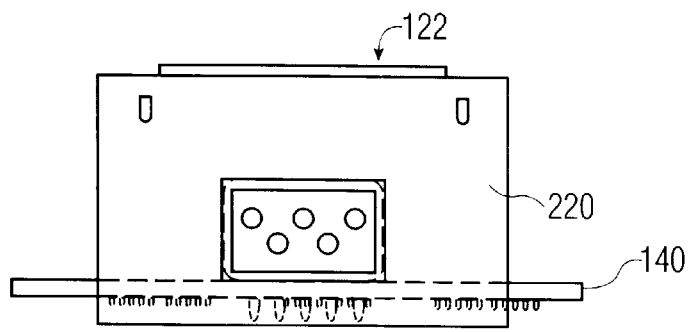

FIG. 1 illustrates an example ballast assembly 100 in accordance with this invention. In this example assembly 100, two connectors 130 are provided, one at each end of the assembly. Each connector 130 is a dual port connector that allows wires 190 to be connected from two directions, via a top access opening 122, and a side access opening 126. Each port of the dual port connector provides a plurality of connections to a printed circuit board 140. An insulating cover 200 envelops each connector 130, and is illustrated in detail in FIG. 2, discussed further below. The circuit board assembly 300 comprising the connector 130, the insulating cover 200, and the circuit board 140 is illustrated in detail in FIG. 3, also discussed further below. This circuit board assembly 300 is enclosed by an enclosure cover 110, and a corresponding enclosure base 115, shown as hatched cross sections in FIG. 1, with access openings 122, 126 for access to the connectors 130 within the insulating cover 200. As in conventional ballasts assemblies, the enclosure cover 110 envelops the circuit board assembly on four sides and below, and the enclosure base 115 completes the enclosure by providing a top surface. Typically, the enclosure is attached to the lighting fixture (not shown) at the base 115, and may be oriented in any configuration; the terms top, side, and bottom are used herein for ease of reference with regard to the figures, and are not intended to imply a limitation.

The example ballast assembly 100 includes components 142 that are mounted on the circuit board 140, and typically includes at least one transformer 142' that is substantially more massive than other circuit components. As is common in the art, mechanical support is provided to the transformer 142' via a potting material 148. The potting material 148 is typically poured onto the board 140 in the vicinity of the mounting location of the transformer 142, and the transformer 142' is subsequently placed, or "potted", into the paste-like potting material. In a preferred embodiment, the insulating cover 200 envelops the connector 130 so that the potting material 148, or any other material, cannot reach the connector 130. That is, the insulating cover 200 provides a region about the connector 130 that is isolated from the remaining region of the assembly 100. In one embodiment of this invention, an isolating segment 125 is also provided to further partition the isolated region into two regions, a top access region 123, and a side access region 127.

FIG. 2 illustrates an example insulating cover 200 in accordance with this invention, and FIG. 3 illustrates the configuration of the insulating cover 200 in the context of an assembly 300 with the connector 130 on the printed circuit board 140, for ease of understanding. The example insulating cover 200 includes a variety of features that facilitate an ease of manufacturing; as discussed below, these features are substantially independent, and alternative embodiments containing fewer features, or incorporated with other features, would be evident to one of ordinary skill in the art in view of this invention. The example insulating cover 200 includes a top flange 210 which serves to seal the internal regions of the overall enclosure 100 of FIG. 1 from the top access opening 122. In like manner, the example insulating cover 200 includes a side flange 220 that seals the internal regions of the enclosure 100 from the side access opening 126. These flanges 210 and 220 also include raised portions 215 and 225, respectively, that facilitate an alignment of the access openings 122, 126 with the corresponding openings in the enclosure base 115 and cover 110. These raised portions 215, 225 also minimize the likelihood of damage that may be caused by the sheet metal openings in the enclosure by forming a border within the openings. The preferred embodiment of the insulating cover 200 is a plastic or ceramic material, and this plastic or ceramic border region provides a smooth surface that protects the wires 190, or the hands that insert the wires, from the sheet metal edges. The example insulating cover 200 also includes one or more protrusions 240 that facilitate the mounting of the insulating cover 200 onto the enclosure cover 110, for example by forming a "hook" that is passed through and down along the side of the enclosure cover 110 as the insulating cover 200 is inserted into the enclosure cover 110.

As illustrated in FIG. 3, the insulating cover 200 is designed to fit over the connector 130 when the connector 130 is mounted on the circuit board 140. When properly mounted, the connector 130 is aligned with the access openings 122, 126, so that the sockets 132 for receiving wire conductors are directly accessible, and so that the insulating cover 200 lies flush with the circuit board 140, and forms a seal against the ingress of materials, such as a potting compound, from the circuit board 140 into the connector 130. As can be seen from FIG. 3, the insulating cover 200, when properly mounted, effectively prevents a wire that is being inserted into the access openings 122, 126 from contacting components 142 beyond the insulating cover 200. Also, the partition 125 effectively prevents a wire that is being inserted into either access opening 122, 126 from contacting a wire within the other access opening 126, 122, respectively.

The foregoing merely illustrates the principles of the invention. It will thus be appreciated that those skilled in the art will be able to devise various arrangements which, although not explicitly described or shown herein, embody the principles of the invention and are thus within its spirit and scope. For example, not illustrated is the means for mounting the printed circuit board 140. A bottom flange can be added to the insulating cover 200 that could be used to secure the board 140 to the insulating cover 200, which would also provide a tighter seal between the insulating cover 200 and the circuit board 140. Alternatively, or in addition, tabs can be added to the lower region of the side flange 220 to support the printed board 140. These and other system configuration and optimization features will be evident to one of ordinary skill in the art in view of this disclosure, and are included within the scope of the following claims.

We claim:

1. A ballast device comprising:

an enclosure having a first opening on a top surface, and a second opening on a side surface, a printed circuit board that is mounted in the enclosure, a dual port connector that is mounted on the printed circuit board having a first port for receiving a first set of wires and a second port for receiving a second set of wires, and is configured such that when the printed circuit board is mounted in the enclosure, the first port is aligned with the first opening in the enclosure and the second port is aligned with the second opening, and an insulating cover that is configured to envelop the dual port connector when the dual port connector is mounted on the printed circuit board so as to prevent a flow of material from the printed circuit board onto the dual port connector.

2. The ballast device of claim 1, wherein the insulating cover includes
 a top flange about a top opening in the insulating cover and wherein the insulating cover is configured such that,
 when configured to envelop the dual port connector:
  the top flange extends to the top surface of the enclosure, and
  the top opening in the insulating cover is aligned with the first opening in the enclosure.

3. The ballast device of claim 1, wherein the insulating cover is further configured to prevent a wire from the first or second set of wires from contact with the printed circuit board, except via the dual port connector.

4. The ballast device of claim 1, wherein the insulating cover is further configured to reduce a likelihood of contact between a wire from the first or second set of wires and the enclosure when the wire is inserted into the first or second openings in the enclosure.

5. The ballast device of claim 1, wherein the enclosure is a sheet metal material, and the insulating cover is a plastic material.

6. The ballast device of claim 1, further including a transformer that is mounted on the printed circuit board and is operably coupled to the dual-port connector.

7. The ballast device of claim 1, wherein the insulating cover includes a side flange about a side opening in the insulating cover and wherein the insulating cover is configured such that, when configured to envelop the dual port connector:

the side flange extends to the side surface of the enclosure, and the side opening in the insulating cover is aligned with the side opening in the enclosure.

8. The ballast device of claim 7, wherein the insulating cover further includes a top flange about a top opening in the insulating cover and wherein the insulating cover is further configured such that, when configured to envelop the dual port connector:

the top flange extends to the top surface of the enclosure, and the top opening in the insulating cover is aligned with the first opening in the enclosure.

9. The ballast device of claim 8, wherein the top flange includes a raised border area that facilitates alignment of the top opening in the insulating cover and the first opening in the enclosure.

10. The ballast device of claim 8, wherein the side flange includes a raised border area that facilitates alignment of the side opening in the insulating cover and the side opening in the enclosure.

11. An insulating cover for enveloping a dual port connector comprising:

a plurality of side walls that surround the dual port connector, and a top wall that is supported by the pluraltity of side walls and extends above the dual port connector, wherein the top wall includes a top opening for allowing access to a top port of the dual port connector, and a side wall of the plurality of side walls includes a side opening for allowing access to a side port of the dual port connector wherein the plurality of side walls are sized such that the dual port connector is isolated from an interior region of an enclosure when the dual port connector and the dual port are mounted in the enclosure, and the top wall is configured to form a flange that surrounds a top hole in the enclosure.

12. The insulating cover of claim 11, wherein the top wall is further configured to contain a raised region that facilitates an alignment of the top opening of the top wall with the top hole in the enclosure.

13. The insulating cover of claim 11, wherein the side wall is configured to form a flange that surrounds a side hole in the enclosure.

14. The insulating cover of claim 13, wherein the side wall is further configured to contain a raised region that facilitates an alignment of the side opening of the side wall with the side hole in the enclosure.

15. The insulating cover of claim 11, further including at least one protrusion that facilitates an attachment of the insulating cover to the enclosure.

16. The insulating cover of claim 15, further including an interior wall that is configured to isolate a top region about the top port of the dual port connector from a side region about the side port of the dual port connector when the insulating cover envelops the dual port connector.

17. An insulating cover for enveloping a dual port connector comprising:

a plurality of side walls that surround the dual port connector, and a top wall that is supported by the pluraltity of side walls and extends above the dual port connector, wherein the top wall includes a top opening for allowing access to a top port of the dual port connector, and a side wall of the plurality of side walls includes a side opening for allowing access to a side port of the dual port connector wherein the plurality of side walls are sized such that the dual port connector is isolated from an interior region of an enclosure when the dual port connector and the dual port are mounted in the enclosure, and wherein the side wall is configured to form a flange that surrounds a side hole in the enclosure.

18. An insulating cover for enveloping a dual port connector comprising:

a plurality of side walls that surround the dual port connector, and a top wall that is supported by the pluraltity of side walls and extends above the dual port connector, wherein the top wall includes a top opening for allowing access to a top port of the dual port connector, and a side wall of the plurality of side walls includes a side opening for allowing access to a side port of the dual port connector wherein the plurality of side walls are sized such that the dual port connector is isolated from an interior region of an enclosure when the dual port connector and the dual port are mounted in the enclosure, further including at least one protrusion that facilitates an attachment of the insulating cover to the enclosure.

* * * * *